United States Patent
Park et al.

(10) Patent No.: US 7,052,576 B2
(45) Date of Patent: May 30, 2006

(54) PRESSURE CONTROL APPARATUS AND METHOD OF ESTABLISHING A DESIRED LEVEL OF PRESSURE WITHIN AT LEAST ONE PROCESSING CHAMBER

(75) Inventors: Jin-Jun Park, Seoul (KR); Jin-Seok Hong, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 259 days.

(21) Appl. No.: 10/322,557

(22) Filed: Dec. 19, 2002

(65) Prior Publication Data

US 2003/0131792 A1    Jul. 17, 2003

(30) Foreign Application Priority Data

Jan. 17, 2002  (KR) ................... 2002-2715

(51) Int. Cl.
*B05C 11/00*  (2006.01)
*C23F 1/00*  (2006.01)
*H01L 21/306*  (2006.01)

(52) U.S. Cl. ................. 156/345.24; 118/688; 118/692; 118/715; 118/719; 156/345.26

(58) Field of Classification Search ................ 118/715, 118/728, 692, 688; 156/345.31–33, 345.24, 156/345.26
See application file for complete search history.

(56) References Cited

U.S. PATENT DOCUMENTS

| | | | | |
|---|---|---|---|---|
| 5,009,738 A | * | 4/1991 | Gruenwald et al. | .... 156/345.47 |
| 5,423,936 A | * | 6/1995 | Tomita et al. | ......... 156/345.34 |
| 5,928,963 A | * | 7/1999 | Koshiishi | .................... 438/714 |
| 6,228,170 B1 | | 5/2001 | Chen et al. | ................. 118/663 |
| 2002/0129768 A1 | * | 9/2002 | Carpenter et al. | .......... 118/715 |

* cited by examiner

*Primary Examiner*—Rudy Zervigon
(74) *Attorney, Agent, or Firm*—Volentine Francos & Whitt, PLLC (57) ABSTRACT

A desired level of pressure is established in at least one chamber that forms part of a closed atmosphere, such as in a semiconductor device processing facility. A pressure control system includes at least one space increase/decrease device that has a partition which is movable to increase and/or decrease the volume of free space within the chamber(s), a pressure sensor for detecting the pressure within the chamber(s), and a controller for controlling the movement of the partition based on the detected pressure. A chamber is provided with positive or negative pressure to increase or decrease the pressure therein while the pressure in the chamber is monitored. As soon as the pressure within the chamber equals a predetermined pressure, the providing of the positive or negative pressure is stopped. The partition is moved to vary the effective volume of free space in the chamber(s) to change the pressure in the chamber from the predetermined pressure to the desired pressure.

3 Claims, 10 Drawing Sheets

PRESSURE CONTROL APPARATUS AND METHOD OF ESTABLISHING A DESIRED LEVEL OF PRESSURE WITHIN AT LEAST ONE PROCESSING CHAMBER

BACKGROUND OF THE INVENTION

1. Field of the Invention

The present invention relates to the controlling of pressure in a fluid system. More particularly, the present invention relates to a method of and apparatus for establishing and maintaining a predetermined level of pressure within at least one processing chamber that forms part of a closed atmosphere.

2. Description of the Related Art

In general, the manufacturing of high-tech products, including semiconductor devices, requires establishing precise conditions in a production environment to achieve high yields. These conditions include pressure, temperature, environmental purity and the like. In such a production environment, pressure is regarded as a key factor in preventing the influx of external contaminants as well as a parameter necessary for facilitating certain processes. An example of a production environment in which a certain level of pressure must be established and maintained will be described with reference to prior art semiconductor device manufacturing and processing facilities.

Figure 1:
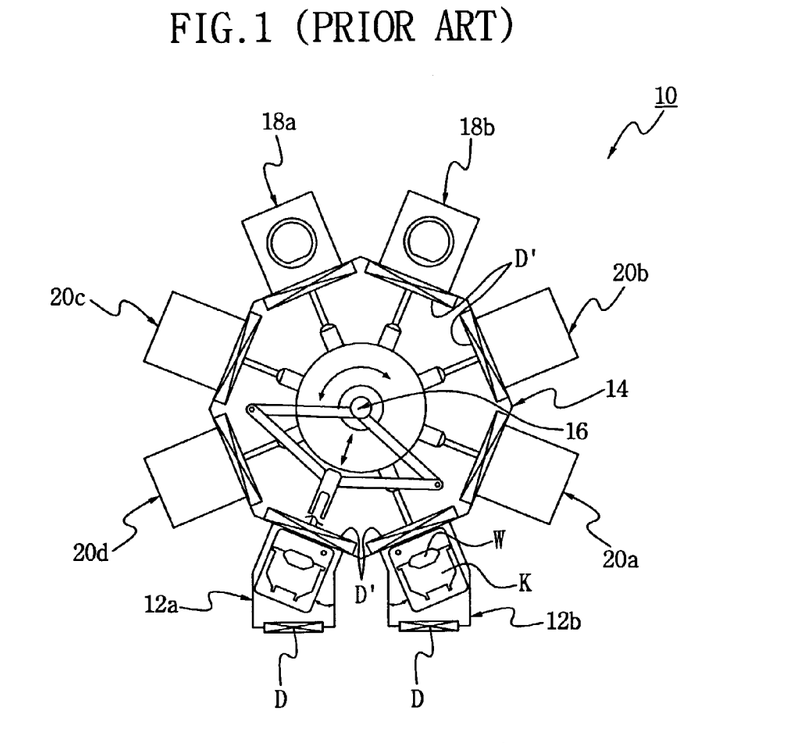
FIG. 1 is a schematic diagram of a prior art multi-chamber semiconductor device manufacturing and processing facility.

FIG. 1 illustrates a prior art multi-chamber semiconductor device manufacturing and processing facility. In this facility 10, loadlock chambers 12a, 12b are coupled by doors D, at one side of the facility, for selective communication with a production line. Initially, a cassette C filled with a plurality of wafers W is inserted from the production line into a respective one of the loadlock chambers 12a, 12b. The environment inside the loadlock chamber 12a, 12b is then isolated from the production line when the door D is closed. Subsequently, a vacuum is created within the loadlock chamber 12a, 12b.

The facility 10 also includes a transfer chamber 14 positioned at one side of the loadlock chambers 12a, 12b. The transfer chamber is disposed in-line with the loadlock chambers 12a, 12b and is placed in selective communication therewith via doors D'. The inside of the transfer chamber 14 is generally kept at a predetermined negative pressure, which will hereinafter be referred to as vacuum pressure. In addition, a robot 16 is installed at a predetermined position within the transfer chamber 14. The robot 16 is configured to fixedly support individual wafers and is programmed to transfer the wafers to various positions within the facility 10.

Processing chambers 18a, 18b for processing the wafers and auxiliary chambers 20a, 20b, 20c, 20d for performing pre- and post-processing steps are installed at the other side of the transfer chamber 14. The processing chambers 18a, 18b and the auxiliary chambers 20a, 20b, 20c, 20d selectively communicate with the transfer chamber 14 via respective doors D'. Like the transfer chamber 14, the insides of the processing chambers 18a, 18b and auxiliary chambers 20a, 20b, 20c, 20d are all kept at a predetermined vacuum pressure.

In this type of facility, one purpose of the loadlock chambers 12a, 12b is to provide a transition for the wafers—from the room pressure state of the processing line to the vacuum pressure required for the processing of the wafers. Another purpose of the loadlock chambers 12a, 12b is to prevent particles from the production line from invading the downstream chambers when the wafers are introduced into the processing facility 10.

The time that it takes to change the pressure state in a loadlock chamber 12a, 12b, from room pressure to the required vacuum pressure state and vice versa, is proportional to the size of the loadlock chamber 12a, 12b. Therefore, any unnecessary space within the loadlock chambers 12a, 12b must be minimized in an effort to reduce the overall processing time.

Moreover, the pressure states within any of the chambers 12a, 12b, 14, 18a, 18b, 20a, 20b, 20c, 20d must be maintained when the doors D' associated therewith are simultaneously open while the wafers W are being transferred therebetween. Otherwise, the gas within these chambers would flow out due to a pressure difference between the chambers. If the gas were to flow from one chamber to another, the gas might entrain particles, whereby the wafers W or the processing facility 10 could become contaminated. Also, the flow of gas might give rise to an eddy phenomenon which could, in turn, bring about a change in other processing conditions such as temperature, the supply of processing gas, pressure and the like. In these cases, the changes in the processing conditions could lead to processing failures.

Figure 4:
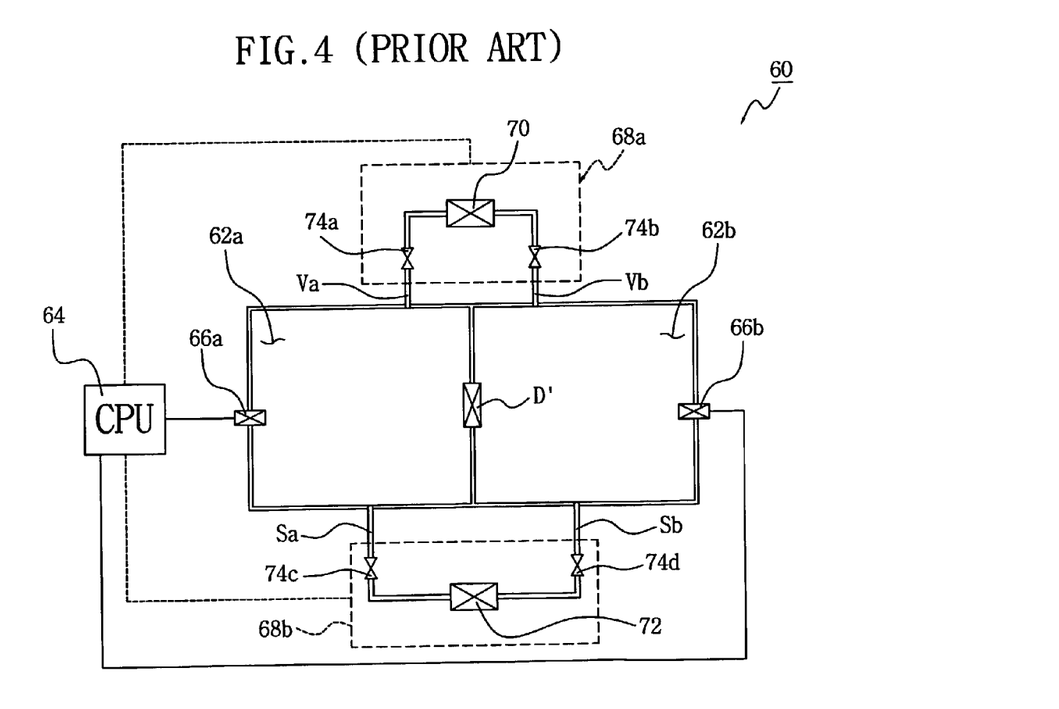
FIG. 4 is a cross-sectional schematic diagram of two connected processing chambers, and prior art pressure control apparatus for controlling the pressure within the chambers.

Conventional pressure control apparatus 60 for balancing the pressure between first and second mutually communicating object chambers is shown in FIG. 4. Pressure sensors 66a, 66b are installed on respective sides of the first and second object chambers 62a, 62b, for detecting the internal pressure levels of the first and second object chambers 62a, 62b, respectively, and separately transmitting the signals indicative of the pressure levels to a controller 64.

Also, pressure supply systems 68a, 68b are coupled to other sides of the first and second object chambers 62a, 62b for supplying a predetermined level of pressure into the object chambers 62a, 62b according to the control signals transmitted from the controller 64. The pressure supply systems 68a, 68b comprise a vacuum pump 70 connected to the object chambers 62a, 62b by vacuum lines Va, Vb, respectively, a gas supply device 72 connected to the object chambers 62a, 62b by gas supply pipes Sa, Sb, respectively, and valves 74a, 74b, 74c, 74d disposed in the vacuum lines Va, Vb and the gas supply pipes Sa, Sb for selectively shutting down the flow of gas therethrough.

The pressure control system 60 attempts to establish an identical level of pressure between the first and second object chambers 62a, 62b as follows. First, the controller 64 respectively checks the internal pressures of the first and second chambers 62a, 62b with the pressure sensors 66a, 66b. If there is a difference in pressure between the first and second object chambers 62a, 62b, the valves 74a, 74b, 74c, 74d in the vacuum lines Va, Vb and gas supply lines Sa, Sb are selectively controlled and opened to supply vacuum pressure or purge gas, thereby adjusting the internal pressure levels of the first and second object chambers 62a, 62b. Then, when the pressure levels of the first and second object chambers 62a, 62b reach the required levels, the controller 64 the valves 74a, 74b, 74c, 74d in the vacuum lines Va, Vb or gas supply pipes Sa, Sb. At the same time, the controller 64 controls the operations of the vacuum pump 70 and the gas supply device 72.

The pressure within the first and second object chambers 62a, 62b is controlled by supplying vacuum pressure or purge gas based on signals generated by the pressure sensors 66a, 66b until the desired internal pressures of the first and second object chambers 62a, 62b are established. However, the detected levels of pressure are not always accurate while the pressure levels are being adjusted, and it is difficult to effect the delicate feedback control required in providing vacuum pressure or purge gas while the pressure levels are being adjusted.

Furthermore, if the internal pressure level of the object chambers becomes exceeds the desired vacuum pressure or positive pressure, additional purge gas or vacuum pressure must be supplied to the respective object chambers, thereby delaying the processing of the wafers. Accordingly, it is important to form a very precise internal pressure within the object chambers from the start. Therefore, the pressure sensors 66a, 66b must be able to detect the static pressure level of the object chambers.

Figure 2:
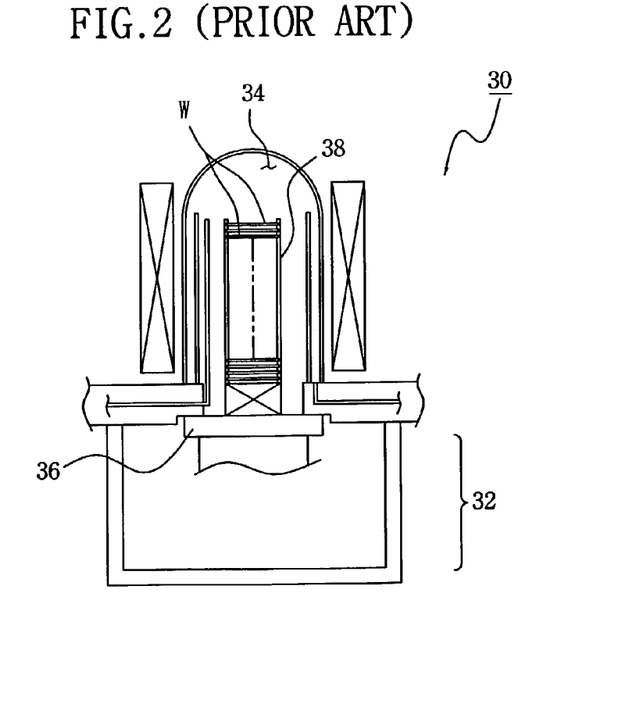
FIG. 2 is a schematic diagram of a bell-shaped chamber of a semiconductor device manufacturing and processing facility.

FIG. 2 illustrates a bell-shaped chamber of a semiconductor device manufacturing and processing facility that simultaneous processes a plurality of wafers. The processing facility 30 includes a loadlock chamber 32 for loading wafers W and a processing chamber 34 disposed over the loadlock chamber 32 for processing the wafers W.

A boat 38 containing a plurality of wafers W is raised from the loadlock chamber 32 to introduce the wafers W into the processing chamber 34. At this time, a block plate 36 seals off the atmosphere of the upper processing chamber 34 from that within the loadlock chamber 32. Then, the wafers W are processed by processing gas at a predetermined vacuum pressure atmosphere and at a certain temperature.

When the processing of the wafers W is completed, the boat 38 loaded with the wafers W is lowered back down into the loadlock chamber 32 while the block plate 36 allows the atmospheres within the processing chamber 34 and the loadlock chamber 32 to communicate.

In this type of facility 30, the atmospheres within the processing chamber 34 and the loadlock chamber 32 become different in terms of pressure and temperature, thereby leading to a natural flow of gases when the block plate 36 opens the processing chamber 34. Even when a balanced pressure state is formed between the processing chamber 34 and the loadlock chamber 32 before the processing chamber 34 is opened by the block plate 36, the relative size of the effective spaces within the processing chamber 34 and the loadlock chamber 32 continuously change by as much as the volume of the block plate 36 and the boat 38. As a result, a pressure differential is produced, thereby causing gas to flow between the loadlock chamber 32 and the processing chamber 34. In this case, particles within the loadlock chamber 32 are introduced into the processing chamber 34, resulting in the contamination of the wafers W and the processing chamber 32.

Also, the various gases induced into the processing chamber 34 are at a relatively low temperature. Accordingly, the wafers W at the bottom of the boat 38 cool more rapidly than those at the top of the boat 38. This condition produces differences in the processed states of the wafers W and leads to a sudden crystallization of the gas remaining within the processing chamber 34. As a result, particles are created and the processed wafers W are not uniform.

Therefore, in order to solve the aforementioned problems, efforts should be made to achieve a pressure balance between the processing chamber 34 and the loadlock chamber 32 and to minimize a change in pressure and temperature caused by the volumetric fluctuations due to the movement of the block plate 36 and the boat 38.

Conventional pressure control apparatus aimed at solving the problems of the prior art in the manner described above is shown in FIG. 3. The apparatus 40 includes an object chamber 42, a controller 44, a pressure sensor 46 for detecting the pressure within the object chamber 42 and transmitting a signal indicative of the detected pressure to the controller 44, and a pressure supply system 48.

Figure 3:
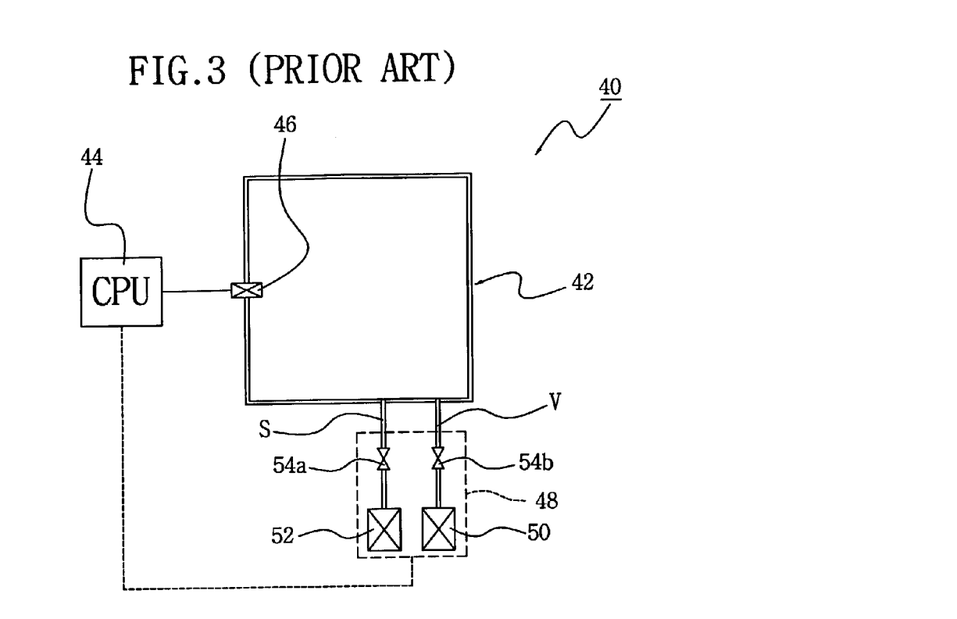
FIG. 3 is a cross-sectional schematic diagram of an object chamber and prior art pressure control apparatus for controlling the internal pressure of the chamber.

The pressure supply system 48 is installed at one side of the object chamber 42 for creating a predetermined level of pressure within the object chamber 42 according to a control signal input thereto from the controller 44. The pressure supply system 48 includes a gas supply device 52 connected to the object chamber 42 by a gas supply pipe S, a vacuum pump 50 connected to the object chamber 42 by a vacuum line V, and valves 54a, 54b for selectively stopping the flow of gases through the gas supply pipe S and vacuum line V.

Next, the steps of establishing a predetermined vacuum pressure within the object chamber 42 will be described. First, the controller 44 drives the vacuum pump 50 with the valve 54b open to create a predetermined vacuum pressure within the object chamber 42. In the course of the operation, the controller 44 continuously monitors the internal pressure of the object chamber 42 with the pressure sensor 46. When the internal pressure of the object chamber 42 approaches the desired level, the controller 44 controls the degree of opening of the valve 54b on the vacuum line V. Then, when the internal pressure state of the object chamber 42 reaches the required level of pressure, the controller 44 closes the valve 54b and at the same time shuts down the operation of the vacuum pump 50.

On the other hand, a room pressure atmosphere is established within the object chamber 42 as follows. The controller 44 opens the valve 54a of the gas supply pipe S and drives the gas supply part 52 to supply a predetermined purge gas into the object chamber 42. The internal pressure of the object chamber 42 is detected by the pressure sensor 46 and a signal indicative of the pressure is transmitted to the controller 44. The controller 44 controls the valve 54a and the gas supply part 52 until the internal pressure of the object chamber 42 reaches room pressure.

However, it is difficult to accurately establish a desired level of pressure by controlling the degree of opening of the valves 54a, 54b and the operations of the vacuum pump 50 and gas supply part 52. In particular, the pressure in the object chamber 42 becomes unstable while fluid is flowing thereinto/therefrom in the course of providing the chamber 42 with vacuum pressure or purge gas. Accordingly, the pressure detected by the pressure sensor 46 is unreliable, and it is difficult to precisely control the supply of vacuum pressure or purge gas.

Moreover, the pressure in the object chamber 42 has a direct effect on the processing that occurs in the chamber. Therefore, an important aspect of the processing operation is to form an extremely precise pressure state in the object chamber 42. If the internal pressure level of the object chamber 42 becomes higher than the desired vacuum pressure or a predetermined high pressure, purge gas or vacuum pressure must be provided immediately. Thus, the pressure sensor 46 must detect the static pressure state of the object chamber 42, so that it is possible to keep the pressure level of the object chamber 42 precise, that is, neither lower nor higher than the required pressure level.

SUMMARY OF THE INVENTION

An object of the present invention is to solve the aforementioned problems of the prior art. It is therefore one object of the present invention to provide a pressure control system and method that can rapidly establish a desired level in at least one chamber in a processing facility. It is another object of the present invention to provide a pressure control system and method that can precisely achieve a balance in pressure between chambers that are to be placed in open communication to facilitate the transfer of objects, such as wafers, therebetween. It is still another object of the present invention to provide a pressure control system and method that can prevent a processing facility having one or more processing chambers from being contaminated by foreign particles.

According to one of the present invention, a pressure control system for controlling the internal pressure of the chamber, comprises: a pressure sensor connected to the chamber, a controller operatively connected to the pressure sensor so as to receive signals indicative of the internal pressure of the chamber from the pressure sensor, at least one space increase/decrease device comprising a movable partition exposed to and delimiting the interior of the chamber, and a driving system operatively connected to the partition and to the controller so as to control the relative position of the partition according to a control signal issued by the controller. The partition is supported so as to be movable relative to fixed sidewalls of the chamber. Accordingly, the movement of the partition can selectively increase and decrease the volume of free space within the chamber. In addition, a pressure supply system is connected to the chamber so as to create a state of pressure within the chamber.

The partition may be a piston slidably fitted within a pipe as sealingly engaged therewith. The driving system may include a pressure-actuated cylinder to control the sliding of the piston within the pipe.

Alternatively, the partition may be a flexible tube corrugated along the length thereof such that the flexible tube is expandable and contractable. In this case, the chamber has a through-hole extending through a sidewall portion thereof. The flexible tube has a closed end, and an open end fixed relative to the sidewall portion so as to provide an air-tight enclosure for the through-hole. The driving system is operative to move the closed end of the flexible tube.

In addition, the pressure supply system may also comprise a case disposed over and covering the space increase/decrease device at the exterior of said chamber, and a secondary pressure sensor disposed at one side of said case so as to detect the pressure within the case. The pressure supply system is connected to the case. The pressure within the case is thus adjustable by the pressure supply system to reduce a difference in pressure between the inside of the chamber and the inside of the case. Accordingly, the load on the partition can be minimized.

A desired level of pressure is established within chamber as follows. The pressure supply system provides the chamber with positive or negative pressure while the pressure is monitored by the pressure sensor and the controller. The controller determines whether the pressure within the chamber equals a predetermined level of pressure. As soon as the pressure within the chamber equals the predetermined pressure, the operation of the pressure supply system is operated to cut off, whereby the pressure in the chamber becomes static. Finally, once the pressure in the chamber has become static, the effective volume of free space in the chamber is varied by the space increase/decrease device to change the pressure in the chamber from the predetermined pressure to the desired pressure.

Preferably, the partition is moved in a direction that reduces the volume of free space within the chamber while the pressure in the chamber is being increased or decreased during the course of producing the predetermined level of pressure. In this way, the amount of time necessary to produce the predetermined level of pressure in the chamber is decreased.

According to another aspect of the present invention, a pressure control system for controlling the internal pressures of at least two interconnected chambers, comprises at least one space increase/decrease device each defining a passageway that extends between the chambers, and having a partition disposed in the passageway. The partition is exposed to and delimits the interiors of both of the chambers. The partition is also supported so as to be movable relative to fixed sidewalls of the chambers, whereby the partition can be moved to selectively increase the volume of free space within one of the chambers and decrease the volume of free space within the other of the chambers. Hence, the pressure levels in the chambers can be balanced.

Preferably, the pressure control system includes two space increase/decrease devices. The passageway of one of the devices extends through a common sidewall that separates the interior of the chambers from one another. On the other hand, the passageway of the other space increase/decrease device extends outside of the chambers between respective fixed sidewalls thereof.

The partition may be a piston slidable along the passageway as sealing engaged therewith. Preferably, the piston comprises a pair of piston members spaced from one another along the length of the passageway, and a support member interconnecting and spacing the piston members apart. In this case, a driving system operatively connected to the controller may be connected to the space increase/decrease device between the piston members thereof to control the movement of the piston members. Still further, a brake may be interposed between the piston members and operative to selectively fix the piston members in place in the passageway.

On the other hand, the partition may be one or more flexible tubes corrugated along the length thereof whereby the flexible tube is expandable and contractable. The flexible tube has a closed end, and an open end fixed relative to the sidewalls of the chambers.

The pressure control system may also comprise a secondary pressure sensor disposed in the passageway of each space increase/decrease device, and a pressure supply system connected to the chambers and to the passageway. The pressure supply system is operatively connected to the controller so as to create a state of pressure within the chambers and the passageway under the control of said controller based on the levels of pressure as detected by the respective pressure sensors.

The pressure in the chambers can be balanced as follows before the chambers are placed in open communication with one another. First, the pressure within the chambers is monitored by the pressure sensors and controller. The pressure supply system is controlled to provide only a selected one of the chambers with positive or negative pressure to increase or decrease the pressure within that chamber. The controller then determines whether the pressure within the selected chamber equals a predetermined level. As soon as the pressure within the chamber equals the predetermined pressure, the pressure supply system is operated to stop providing the chamber with positive or negative pressure. Under these conditions the space increase/decrease device can be used to balance the levels of pressure within the chambers by increasing the volume of the free space in one of the chambers while decreasing the volume of free space in the other of the chambers.

More specifically, the movement of the partition(s) of the space increase/decrease device(s) maybe sufficient to effect the total changes in volumes necessary to achieve the balance of pressure in the chambers. However, if need be, if the volumetric capacity of the pressure increase decrease device(s) is insufficient, the pressure supply system can be operated to supply purge gas into one of the chambers until the pressure levels are precisely balanced.

The brake of the space increase/decrease device can be controlled to fix its associated partition in place while the selected chamber is provided with positive or negative pressure, to then release the partition once the positive or negative pressure is no longer being provided, and to again fix the partition in place once the levels of pressure within the chambers have become equal.

BRIEF DESCRIPTION OF THE DRAWINGS

These and other objects, features and aspects of the invention will become apparent from the following description of the preferred embodiments thereof made with reference to the accompanying drawings, of which.

DETAILED DESCRIPTION OF THE PREFERRED EMBODIMENTS

Hereinafter, preferred embodiments of a pressure control apparatus and a pressure control method in accordance with the present invention will be described in detail with reference to accompanying drawings. Like reference numerals designate like parts throughout the drawings.

Figure 5:
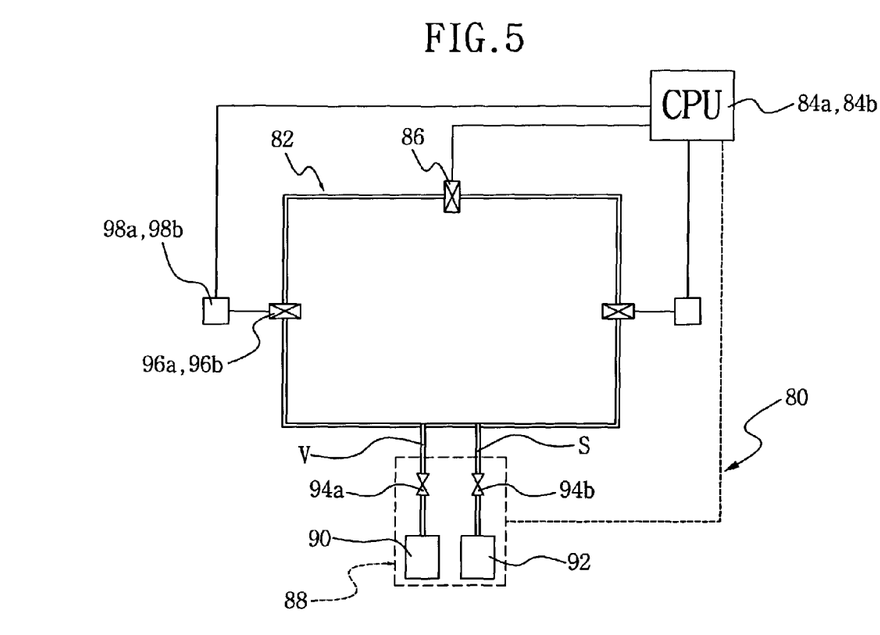
FIG. 5 is a cross-sectional schematic diagram of the combination of a processing chamber and pressure control apparatus in accordance with the present invention.

Referring first to FIG. 5, the pressure control apparatus 80 of the present invention comprises: a CPU including a controller 84a, 84b, a pressure sensor 86 installed in the chamber for detecting the internal pressure of a chamber 82 and transmitting a signal indicative thereof to the controller 84a, 84b, and a pressure supply system 88 driven by control signals transmitted from the controllers 84a, 84b to establish a predetermined level of pressure in the chamber 82.

The pressure supply system 88 includes a vacuum line V connected to the chamber 82, a vacuum pump 90 that exhausts the chamber 82 through the vacuum line V, a gas supply pipe S connected to the chamber 82, a gas supply part 92 that supplies purge gas into the chamber 82 through the gas supply pipe S, and valves 94a, 94b disposed in the vacuum and gas lines V, S to selectively shut down the flow of fluid therethrough according to a control signal input from controllers 84a, 84b.

The pressure control apparatus 80 also includes at least one space increase/decrease device 96a, 96b connected to the chamber 82. The space increase/decrease device 96a, 96b comprises a partition that delimits the chamber 82. The position of the partition can be changed to, in effect, reduce or expand the volume of the chamber 82. To this end, the space increase/decrease device 96a, 96b is connected to a driving system 98a, 98b for varying the position of the partition relative to the fixed sidewalls that delimit the interior of the chamber 82.

Figure 6:
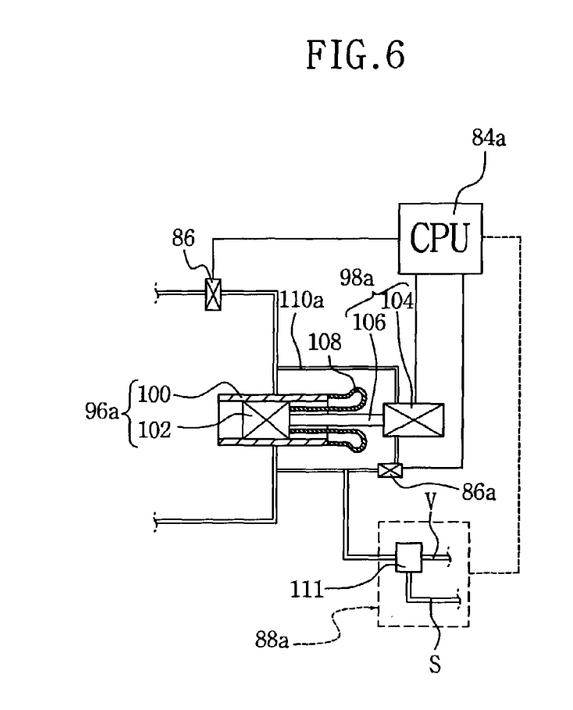
FIG. 6 is a schematic diagram of a space increase/decrease device and a related driving system of the pressure control apparatus shown in FIG. 5.
Figure 7:
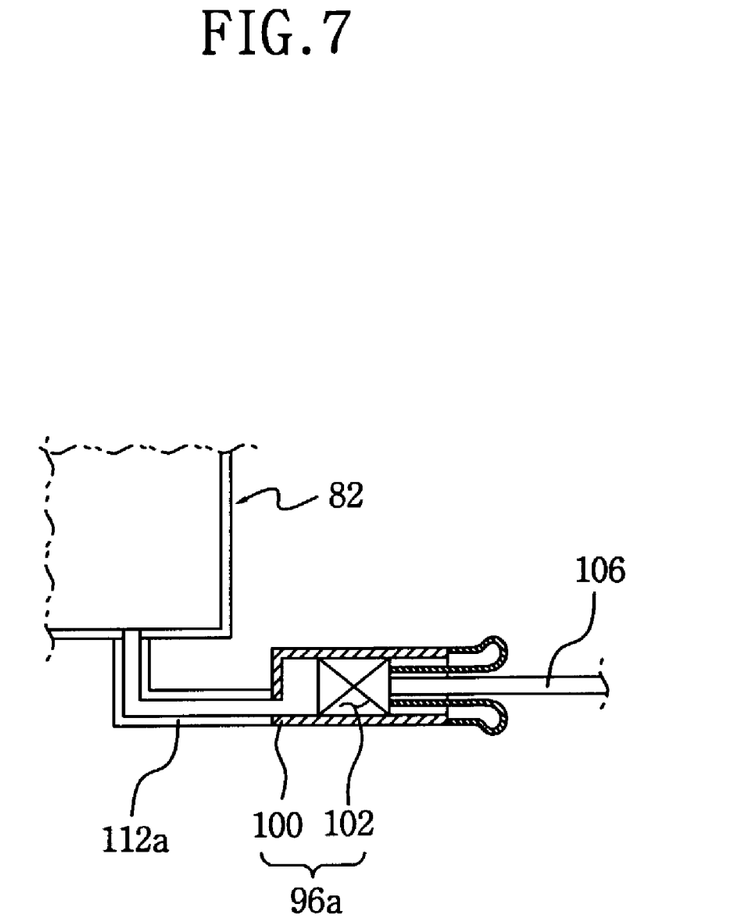
FIG. 7 is a sectional view of another embodiment of the space increase/decrease device.

A first embodiment of the space increase/decrease device, namely space increase/decrease device 96a will be described with reference to FIG. 6. The space increase/decrease device 96a includes a pipe 100 extending through a lateral part of the chamber 82 in an air-tight manner, and a piston 102 for slidably moving along the inside of the pipe 100 as sealingly engaged therewith. Alternatively, as shown in FIG. 7, the space increase/decrease device 96a may additionally comprise a connection pipe 112a that extends from one end (the bottom) of the chamber 82.

Referring again to FIG. 6, the driving system 98a may include a cylinder 104 spaced from the exterior of the chamber 82, and a cylinder axle 106 connected to the piston 102. Thus, the cylinder 104 may be actuated by the controller 84a to slide the piston 102 within the pipe 100, thereby expanding or reducing the effective size of the internal space of the chamber 82.

Alternatively, the driving system 98a may include a motor to be controlled by the controller 84a, screw threads formed on the motor axle or on an output shaft connected with the motor axle, and a slider connected to the piston 102 and threaded to the motor axle or the output shaft so as to slide the piston 102 when the motor axle or the output shaft is rotated. In this case, the slider may be integral with the piston 102. Still further, the driving system 98a may instead comprise a rack and pinion, or a cam mechanism for converting rotation of the cam into straight line reciprocating movement of the piston 102.

In addition, a flexible tube 108 extends between the pipe 100 and the piston 102 for ensuring the air-tightness of the chamber 82 at the piston 102 and pipe 100. The flexible tube 108 may be a corrugated metal flex tube (shape of a bellows) or a rubber tube.

Also, a case 110 can be used instead of or in addition to the tube 108 to provide an air-tight cover for the space increase/decrease part 96a. Another pressure sensor 86a may be installed at one side of the case 110 for detecting the internal pressure of the case 110 and transmitting a signal indicative of the detected pressure to the controller 84a.

Furthermore, a pressure supplying system 88a can be connected to the space increase/decrease device 96a. The pressure supplying system 88a supplies pressure according to signals from the controller 84a when there is a difference in pressure between the chamber 82 and the inside of the case 110 to reduce the load of driving the piston 102. The pressure supplying system 88a can be an integral part of the main pressure supplying system 88 or can be a totally independent system. If the pressure supplying system 88a is an integral part of the main pressure supplying system 88, the vacuum line V and gas supply pipe S of the main pressure supplying system 88 are merely integrated with the case 110. This can be accomplished by a three-way valve 111 to selectively control the supply of vacuum pressure or purge gas according to the control signals issued by the controller 84a.

Figure 8:
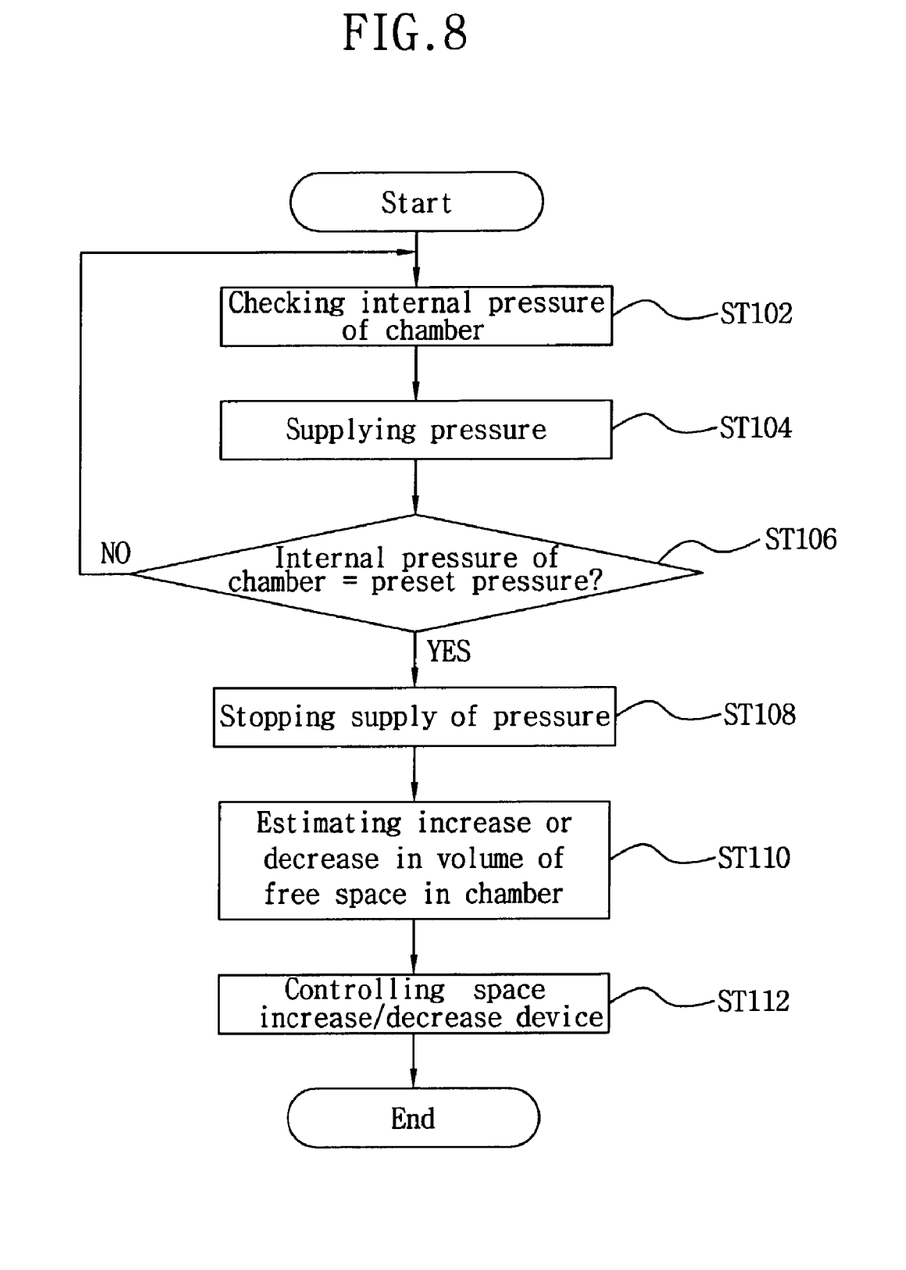
FIG. 8 is a flowchart of a method of establishing a desired level of pressure in a chamber in accordance with the present invention.

The method of controlling the pressure in the chamber 82 of the system 80 will be described with reference to FIG. 8. First, the controller 84a checks the internal pressure of the chamber 82 using the pressure sensor 86 (ST102), and provides the chamber 82 with vacuum pressure by operating the vacuum pump 90 (ST104). The internal pressure of the chamber 82 is compared with a preset vacuum pressure (ST106). If the internal pressure is equal to the preset pressure, the valves 94a, 94b in the vacuum line V are instantly shut down and the operation of the vacuum pump 90 is stopped (ST108). When the atmosphere within the chamber 82 stabilizes, a change in the volume of the chamber 82 necessary to create additional/less pressure is estimated on the basis of the pressure detected by the pressure sensor 86 (ST110). This increase or decrease in the pressure is calculated to achieve the desired pressure in the chamber, e.g., the pressure required for performing processing within the chamber. Then, the piston 102 is controlled by the driving part 98a on the basis of this change in volume corresponding to the difference in the pressure level existing in the chamber 82 and the desired level of pressure, thereby creating the desired level of pressure in the chamber 82 (ST112). Note, the movements of the piston 102 necessary to effect the required changes in the volume of the chamber 82 can be easily predetermined by tests that check the changes in pressure against the operation of the space increase/decrease part 96a.

In this method according to the present invention, the level of pressure at which the valves 94a, 94b are shut, that is, the preset pressure, may be less than the level of pressure that is desired in the chamber 82. In this case, the space increase/decrease device 96a is used to reduce the internal volume of the chamber 82. In other words, the piston 102 is moved inwardly relative to the chamber 82. On the other hand, the preset level of pressure when the valves 94a, 94b are shut may be greater than a desired vacuum pressure. Accordingly, the space increase/decrease device 96a is used to expand the internal volume of the chamber 82. In other words, the piston 102 is moved outwardly relative to the chamber 82. In view of the above, the stroke of the piston 102 must be great enough to sufficiently increase or decrease the internal volume of the chamber 82. Preferably, then, the piston 102 is set up in the middle of the tube 100 so that it may either expand or reduce the internal volume of the chamber 82.

In the above-described process, the vacuum pressure is supplied while the piston 102 reduces the internal volume of the chamber 82, thereby in effect reducing the time during which the vacuum pressure must be provided to create the preset level of pressure in the chamber 82. Then, the internal volume of the chamber 82 is increased or decreased by the piston 102 in response to the pressure detected by the pressure sensor 86, that is the static level of pressure that is present without fluid flowing through the chamber. That is, the chamber 82 is rapidly provided with vacuum pressure through the vacuum line V without the need to control the valves 94a, 94b, thereby also saving time in achieving the desired vacuum pressure in the chamber 82.

Figure 9:
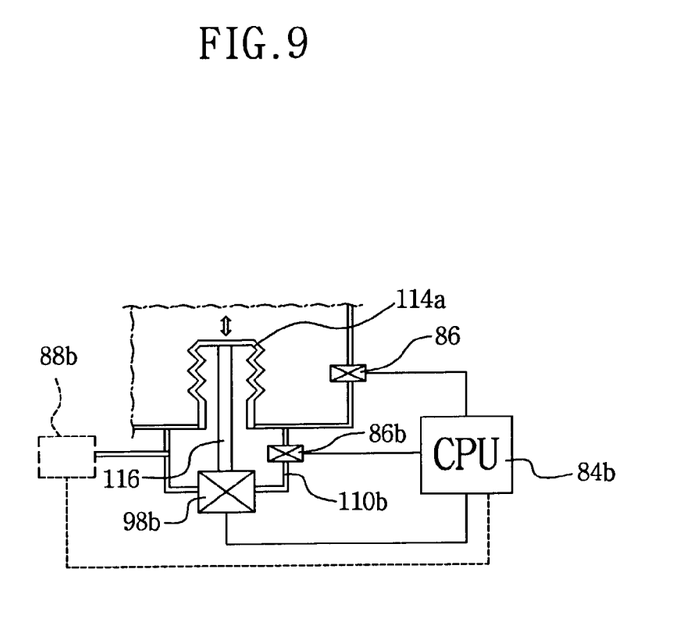
FIG. 9 is a schematic diagram of another embodiment of a space increase/decrease device and its related driving system.
Figure 10:
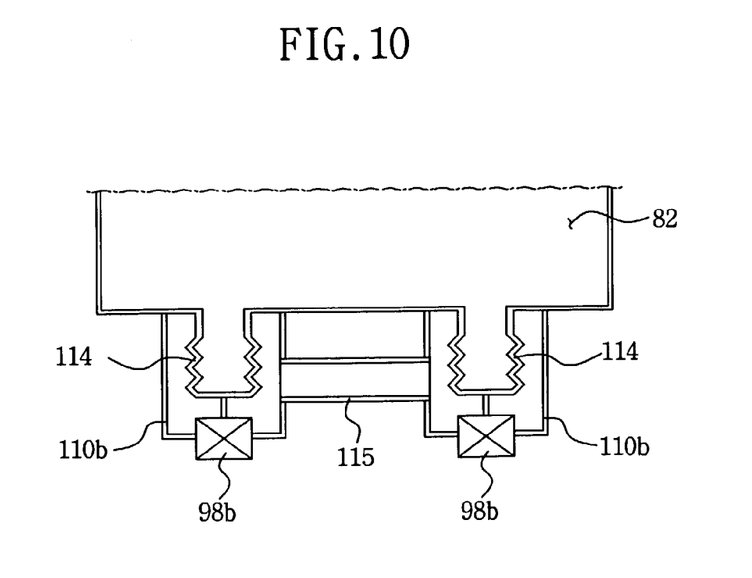
FIG. 10 is a schematic diagram of yet another embodiment of a space increase/decrease device for use in the pressure control apparatus shown in FIG. 5.
Figure 11:
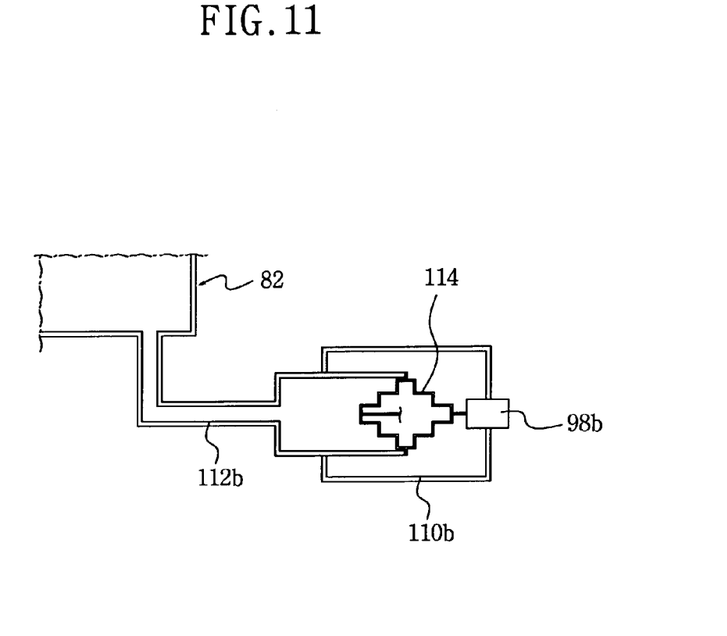
FIG. 11 is a schematic diagram of still another embodiment of a space increase/decrease device for use in the pressure control apparatus shown in FIG. 5.

The space increase/decrease device may also have a structure as shown in any of FIGS. 9 through 11 and designated by reference numeral 98b. These forms of the space increase/decrease device 96b will be described below.

First, referring to FIGS. 9 and 10, the object chamber 82 has one or more through-holes in a sidewall thereof. The space increase/decrease device 96b includes at least one corrugated flex tube 114 having an open end fixed to the sidewall of the chamber 82 around the trough-hole in an air-tight manner, and a second closed end. The tube 114 extends from the sidewall of the chamber 82 so as to be expandable and contractable, thereby being capable of increasing or decreasing the internal volume of the chamber 82.

In addition, a driving system 98b is operatively connected to the flex tube 114 to change the shape of the tube 114 by varying the position of the closed end of the tube 114 according to a control signal issued by the controller 84b. As with the driving system 98a described above in connection with the space increase/decrease device 96a, the flex tube 114 can be expanded or contracted by a rod 116 connected to the closed end of the tube 114 and which rod 116 is driven by means such as a cylinder, motor or cam mounted to the external part of the chamber 82. If desired, the pressure control system may include a space increase/decrease device 96a and a driving system 98a disposed across the chamber 82 from the increase/decrease device 96b and driving system 98b that all together are controlled by controllers 84a, 84b to form a desired level of pressure in the chamber 82.

In addition, a case 110b may be mounted to the outside of the chamber 82 for covering the space increase/decrease device 96b, that is, the location where the flex tube 114 is attached to the chamber 82, to maintain the air-tightness of the structure. Another pressure sensor 86b is mounted to one side of the case 110b for detecting the internal pressure of the case 110b and to transmit a signal indicative of the detected pressure to the controller 84b. A pressure supply system 88b is connected to the other side of the case 110b for creating a predetermined level of pressure in the case 110b, under the control of the controller 84b, to reduce the load on the tube 114 by reducing any difference in pressure between the inside of the chamber 82 and the inside of the case 110b. The pressure supply system 88b may be configured similar to that of the pressure supply system 88a described in connection with the case 110a and piston 102.

Furthermore, the pressure supply system 88b can be used as means for controlling the expansion and contraction of the flex tube 114. In this case, the driving system 98b can serve as a stopper for limiting the extent to which the tube 114 can be expanded and contracted.

In the embodiment of FIG. 10, the space increase/decrease device 96b includes two flex tubes 114, driving parts 98b, and cases 110b. A connection pipe 115 places the interiors of the cases 11b in communication with one another. Thus, a change in the volume of either flex tube 114 can result in a corresponding change in the volume of the other flex tube 114.

In the embodiment shown in FIG. 11, the flex tube 114 can have a first fixed portion, and a closed end. A connection pipe 112 extends from the through-hole in the chamber 82. The fixed portion of the flex tube 114 is attached to the connection pipe 112 so that the closed end of the flex tube 114 is exposed to the inside of the chamber 82 via the connection pipe 112. The diameter of this flex tube 114 gradually decreases from the fixed portion to the closed end. The close end of the wrinkle tube 114 can thus be passed through the open fixed portion by the driving system 98b.

The method of forming the desired level of pressure within the chamber 82 using these space increase/decrease devices 96b and driving systems 98b is similar to the method described above in connection with the space increase/decrease devices 96a. Therefore, a detailed description of the method will be omitted for the sake of brevity.

Next, preferred embodiments of pressure control apparatus 120 for establishing a desired balanced pressure in two or more partitioned chambers 122a, 122b will be described with reference to FIGS. 12 through 16. The chambers 122a, 122b are in communication with one another via passages 124a, 124b. Doors through which objects, such as wafers, can pass to and from the chambers are omitted from FIG. 12 to simplify the drawing.

Figure 12:
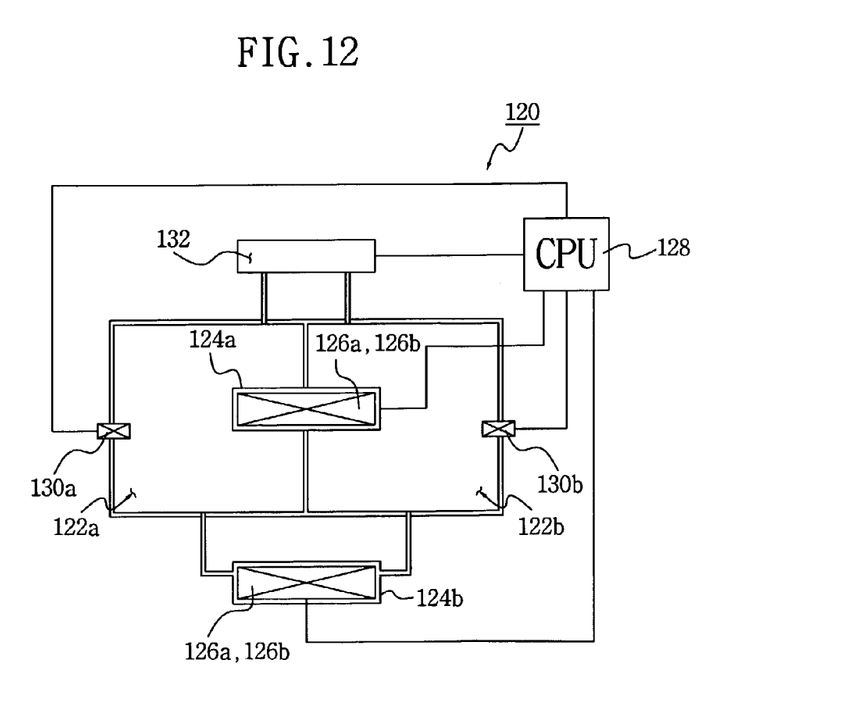
FIG. 12 is a schematic diagram of two connected object chambers, and pressure control apparatus for establishing equal levels of pressure within the chambers in accordance with the present invention.

The pressure control apparatus 120 includes a controller 128, and pressure sensors 130a, 130b disposed at predetermined parts of the chambers 122a, 122b for detecting the internal pressure of the respective chambers 122a, 122b and transmitting signals indicative of the detected pressures to the controller 128. Also, a pressure supply system 132 is connected in common to other parts of the chambers 122a, 122b and is operated according to a control signal transmitted from the controller 128 to provide a predetermined level of pressure in the chambers 122a, 122b.

Space increase/decrease devices 126a, 126b are disposed in and/or define the passages 124a, 124b. The space increase/decrease device 126a (FIG. 13) or 126b (FIGS. 14 and 15) comprises at least one partition in the respective passage 124a, 124b. The partitions can be moved to increase or decrease the internal volumes of the chambers 122a, 122b. The space increase/decrease devices 126a, 126b are configured both inside and outside of the chambers 122a, 122b such that they do not affect other components of the apparatus 120.

Figure 13:
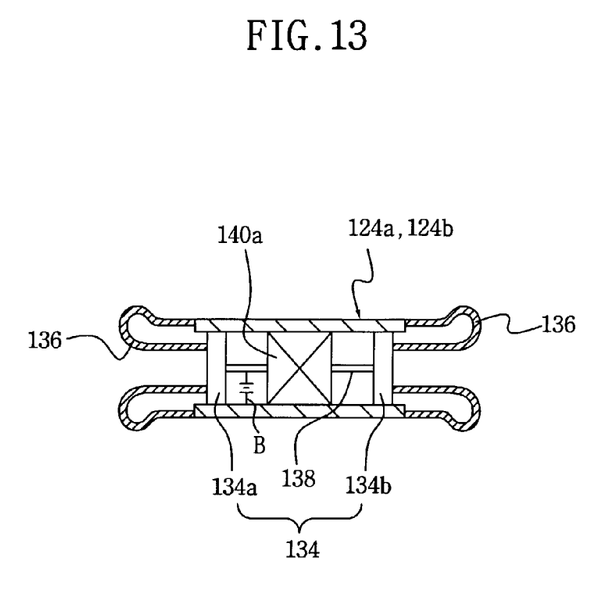
FIG. 13 is a sectional view of a space increase/decrease device used in the apparatus shown in FIG. 12.

The first embodiment of the space increase/decrease device, namely space increase/decrease device 126a, will be described in more detail with reference to FIG. 13. Space increase/decrease device 126a includes a piston 134 slidable within the passageway 124a, 124b as sealingly engaged therewith to maintain the air-tightness of the device. A respective flexible connection tube 136 may be connected to each end of the structure defining the passageways 124a, 124b and to the piston 134 to maintain the air-tightness of the chambers 122a, 122b through the piston 134 and passageways 124a, 124b. The connection tube 136 can be a corrugated metal flex tube or a rubber comprising a synthetic material. However, a corrugated metal flex tube has been found to be more effective.

Also, the piston 134 may comprise two or more separate piston members 134a, 134b. In this case, a support member 138 such as a tie rod may connect the piston members 134a, 134b together so as to maintain their spacing and cause them to slide in unison.

Figure 14:
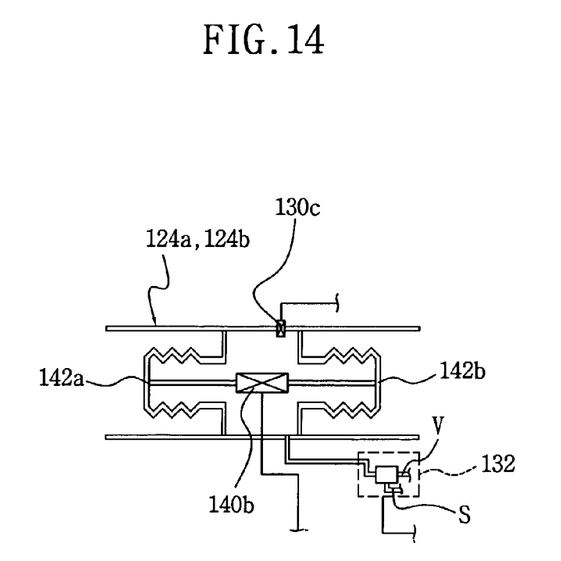
FIG. 14 is a sectional view of another embodiment of the space increase/decrease device.
Figure 15:
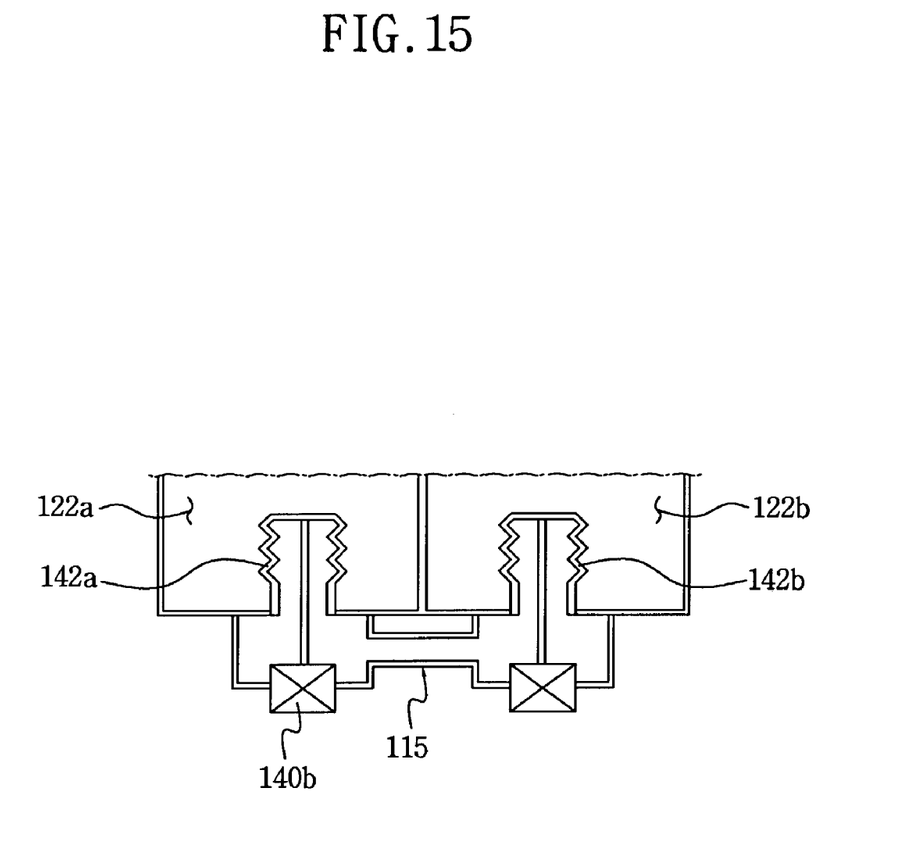
FIG. 15 is a schematic diagram of another space increase/decrease device used in the apparatus shown in FIG. 12.

In addition, the pressure control apparatus 120 includes driving systems 140a, 140b for controlling the movement of the respective partitions of the space increase/decrease devices 126a, 126b according a control signal from the controller 128, to in effect establish the internal volumes of the chambers 122a, 122b. The control signal, i.e., the control of the driving systems 140a, 140b, is based on the signals indicating the internal pressure levels of the chambers 122a, 122b transmitted from the pressure sensors 130a, 130b.

The driving systems 140a, 140b may comprise brakes interposed between the piston members 134a, 134b. The brakes are operable to fix the piston members 134a, 134b in selected positions within the passageways 124a, 124b. Each brake may be in the form of a brake cylinder(s) fixed to the center of the support member 138 and operable press against the lateral wall defining the respective connection passage 124a, 124b when directed to by the controller 128 to fix the piston members 134a, 134b in place. Alternatively, the brake cylinder(s) may be fixed to the lateral wall defining the connection passage 124a, 124b and operable to press against and hence, brake, the support member 138. Such brakes are represented schematically in FIG. 13 by reference character B.

The second embodiment of the space increase/decrease part device, namely, the space increase/decrease device 126b, will now be described with reference to FIGS. 14 and 15. The space increase/decrease part comprises a corrugated flex tubes 142a, 142b disposed within and respectively facing towards the ends of the connection passage 124a, 124b. Each flex tube has one open end, and a closed end that defines the partition of the space increase/decrease device 126b. The tubes 142a, 142b are fixed in place to maintain the air-tightness of the device. Alternatively, the space increase/decrease device 126b may have only one corrugated flex tube.

In the embodiment in which a space increase decrease device 126b has two flex tubes 142a, 142b, if one of the tubes is forced to contract or expand under pressure from the chamber 122a, 122b towards which it faces, the other flex tube will be correspondingly expanded or contracted. The amounts of expansion or contraction of the flex tubes 142a, 142b result in a change in the internal volume of the chambers 122a, 122b and an equalization of the pressure levels thereof. Similar results occur even in the case of the space increase/decrease device 126a comprising piston members 134a, 134b, and in the cases of space increase/decrease devices 126a, 126b having only one piston member or flex tube.

The pressure control apparatus having space increase/decrease devices 126b comprising at least one corrugated flex tube 142, as such, may also comprise driving systems 140b for controlling the contraction or expansion of the tube(s) 142 under the direction of the controller 128. Each driving system 140b may be in the form of a brake or a cylinder.

The pressure control apparatus 120 may also include pressure sensors 130c (see FIG. 14, for example) installed in the connection passages 124a, 124b for detecting the pressure within the flex tubes 142a, 142b. In this case, the pressure supply system 132 (or a discrete pressure supply system) may communicate with the space defined within the flex tubes 142a, 142b and is operated by the controller 128 to provide a predetermined level of pressure therein that mitigates the load caused by the expansion and contraction of the flex tubes 142*a*, 142*b*.

Figure 16:
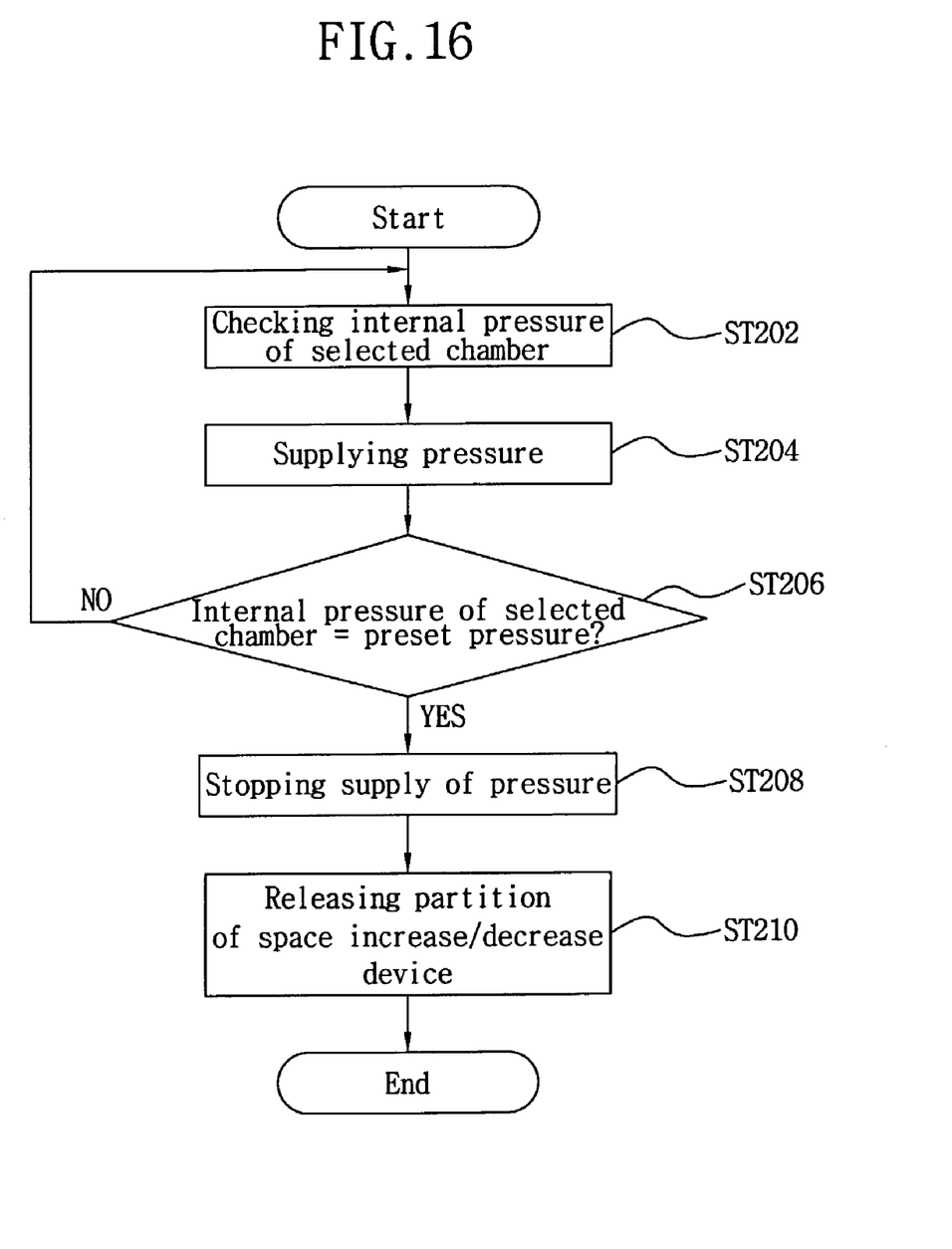
FIG. 16 is a flowchart of a method of establishing desired levels of pressure within connected processing chambers, in accordance with the present invention.

A method of forming equal pressures within the chambers 122*a*, 122*b* will now be described with reference to FIG. 16.

First, the controller 128 checks the internal pressure states of the chambers 122*a*, 122*b* as detected by the pressure sensors 130*a*, 130*b* (ST202). Then, the controller 128 controls the pressure supply system 132 to change the pressure level within a selected one of the chambers 122*a*, 122*b* (ST204). During this time, the controller 128 keeps checking the pressure within the selected one of the chambers 122*a*, 122*b* and compares the pressure to a predetermined pressure (ST206).

The controller 128 shuts down the pressure supply system 132 when the internal pressure of the selected chamber 122*a*, 122*b* reaches the predetermined pressure level (ST208). At this time, the space increase/decrease part(s) 126*a*, 126*b* is/are in a free state (ST210), i.e., the partition(s) thereof are essentially free to move within the passageway(s) 124*a*, 124*b*. Therefore, any difference in the internal pressure of the chambers 122*a*, 122*b* moves the partition(s) in a direction that reduces the internal volume of the chamber 122*a*, 122*b* whose pressure level is lower than the other. On the other hand, the internal volume of the other chamber 122*a*, 122*b* is increased. As a result, the internal pressure levels of the chambers 122*a*, 122*b* become equal.

When the pressure control apparatus has driving systems 140*a*, 140*b* operatively connected to the space increase/decrease devices 126*a*, 126*b*, the controller 128 produces the predetermined pressure level in the selected chamber 122*a*, 122*b* while controlling the driving system 140*a*, 140*b* to prevent the partitions of the space increase/decrease devices 126*a*, 126*b* from moving. Once the predetermined pressure level is achieved, the controller 128 controls the driving systems 140*a*, 140*b* to release the space increase/decrease devices 126*a*, 126*b*, whereupon the pressure levels in the chambers 122*a*, 122*b* are balanced. Then, the driving systems 140*a*, 140*b* are controlled to once again fix the partitions of the space increase/decrease devices 126*a*, 126*b* in place. Then the door that places that chambers 126*a*, 126*b* in communication is opened.

In addition, the controller 128 may control the driving systems 140*a*, 140*b* to forcibly drive the partitions (pistons or flex tubes) of the space increase/decrease part(s) 126*a*, 126*b* in response to a change in pressure caused by a shift in the respective volumes of free space within the two chambers 122*a*, 122*b* while the chambers 122*a*, 122*b* are in open communication with another.

Typically, the preset pressure level of the selected chamber 122*a*, 122*b* is kept within a range that allows the space increase/decrease devices 126*a*, 126*b* to effect the changes in volumes necessary to achieve a balance in pressure. However, if the difference in pressure between the chambers 122*a*, 122*b* is greater than that which can be balanced by changing the volume of the chambers 122*a*, 122*b* using the space increase/decrease 126*a*, 126*b*, the pressure supply system 132 is operated to compensate. That is, the pressure supply system 132 is controlled by the controller 128 to make the internal pressure level of the selected chamber 122*a*, 122*b* equal to that of the other chamber 122*a*, 122*b*. At this time, the shifting of the space increase/decrease devices 126*a*, 126*b* is checked. Once the devices arrive at a position halfway between their maximum strokes, e.g., once the flex tubes 142*a*, 142*b* are located mid-way between the maximum states of extension and retraction thereof, the controller 128 instantly stops the supplying of positive or negative pressure through the pressure supply system 132. In the case of the connection passage 124*b* defined outside of the chambers 122*a*, 122*b*, the structure defining the connection passage 124*b* can be transparent so that the position of the piston 134 or the shape of the flex tube 142 can be visually conformed. Also, an electronic position detecting sensor (not shown) can be provided inside the passages to electronically sense the position of the piston 134 or the shape of the flex tube 142.

As is clear form the description above, the space increase/decrease devices 126*a*, 126*b* operate to keep the pressure of the two chambers 122*a*, 122*b* balanced. However, the space increase/decrease devices 126*a*, 126*b* may at times be fixed in place by the driving systems 140*a*, 140*b*, whereby the effective volumes of the two chambers 122*a*, 122*b* do not change. Also, once a body disposed in one chamber 122*a*, 122*b* is moved to the other chamber 122*a*, 122*b*, the space increase/decrease device 126*a*, 126*b* can operate passively or can be forced to, in effect, increase the volume of the chamber 122*a*, 122*b* from which the body has been withdrawn.

Accordingly, the internal pressure levels of the chambers can be balanced quickly, easily and precisely. Such a precise balance in pressure between the communicating chambers prevents the flow of fluids therebetween, thereby ensuring that the processing facility and the wafers are not contaminated. This, in turn, enhances the operational efficiency of processing facility and hence, the yield of products processed in the facility.

Although the present invention has been described above in connection with the preferred embodiments thereof, it is to be understood that the invention is not limited to those embodiments. Rather, various changes and modifications may be made to the preferred embodiments by one skilled in the art without departing from the true spirit and scope of the invention as defined by the appended claims.

What is claimed is:

1. The combination of at least two interconnected chambers, and a pressure control system for controlling the internal pressures of the chambers, wherein the system comprises:

pressure sensors connected to said chambers so as to detect the internal pressures of the chambers and operative to transmit signals indicative of the detected pressures;

a controller operatively connected to said pressure sensors so as to receive signals indicative of the internal pressures of the chambers from said pressure sensors;

at least one space increase/decrease device defining a passageway that extends between said chambers, said at least one space increase/decrease device comprising a partition disposed in said passageway, the partition being exposed to and delimiting the interiors of both of said chambers and being supported so as to be movable relative to fixed sidewalls of the chambers, the partition of each said at least one space increase/decrease device being movable to selectively increase the volume of free space within one of said chambers and decrease the volume of free space within the other of said chambers, whereby the pressure levels in the chambers can be balanced; and a driving system operatively connected to each said partition and to said controller so as to control the relative position of said partition according to a control signal issued by said controller;

wherein said partition is a piston slidable along said passageway as sealing engaged therewith, and wherein said piston comprises a pair of piston members spaced from one another along the length of said passageway, and a support member interconnecting and spacing said piston members apart.

2. The combination as claimed in claim 1, wherein said space increase/decrease device comprises a brake interposed between the piston members and operative to selectively fix the piston members in place in said passageway.

3. The combination of at least two interconnected chambers, and a pressure control system for controlling the internal pressures of the chambers, wherein the system comprises:

pressure sensors connected to said chambers so as to detect the internal pressures of the chambers and operative to transmit signals indicative of the detected pressures;

a controller operatively connected to said pressure sensors so as to receive signals indicative of the internal pressures of the chambers from said pressure sensors;

at least one space increase/decrease device defining a passageway that extends between said chambers, said at least one space increase/decrease device comprising a partition disposed in said passageway, the partition being exposed to and delimiting the interiors of both of said chambers and being supported so as to be movable relative to fixed sidewalls of the chambers, the partition of each said at least one space increase/decrease device being movable to selectively increase the volume of free space within one of said chambers and decrease the volume of free space within the other of said chambers, whereby the pressure levels in the chambers can be balanced; and a driving system operatively connected to each said partition and to said controller so as to control the relative position of said partition according to a control signal issued by said controller;

wherein said partition is a pair of piston members spaced from one another along the length of said passageway, and said driving system is interposed between said piston members.

* * * * *